United States Patent
Liu et al.

(10) Patent No.: US 10,008,771 B2
(45) Date of Patent: Jun. 26, 2018

(54) PHASE SHIFT SYSTEM

(71) Applicant: Comba Telecom Technology (Guangzhou) Ltd., Guangzhou (CN)

(72) Inventors: Peitao Liu, Guangzhou (CN); Feifei Jia, Guangzhou (CN)

(73) Assignee: Comba Telecom Technology (Guangzhou) Ltd. (CN)

( * ) Notice: Subject to any disclaimer, the term of this patent is extended or adjusted under 35 U.S.C. 154(b) by 114 days.

(21) Appl. No.: 14/786,067

(22) PCT Filed: Jan. 27, 2015

(86) PCT No.: PCT/CN2015/071658
§ 371 (c)(1),
(2) Date: Oct. 21, 2015

(87) PCT Pub. No.: WO2015/127844
PCT Pub. Date: Sep. 3, 2015

(65) Prior Publication Data
US 2016/0064817 A1    Mar. 3, 2016

(30) Foreign Application Priority Data
Feb. 27, 2014  (CN) .......................... 2014 1 0070329

(51) Int. Cl.
*H01Q 3/32* (2006.01)
*H01P 1/18* (2006.01)
*H03H 7/21* (2006.01)

(52) U.S. Cl.
CPC .............. *H01Q 3/32* (2013.01); *H01P 1/184* (2013.01); *H03H 7/21* (2013.01)

(58) Field of Classification Search
CPC ...................................................... H01Q 3/32
(Continued)

(56) References Cited

U.S. PATENT DOCUMENTS

2010/0201591 A1*  8/2010  Girard ................ H01Q 1/246
343/766

FOREIGN PATENT DOCUMENTS

CN      102157767   *  8/2011  ............ H01Q 3/32
CN      102157767 A    8/2011
(Continued)

OTHER PUBLICATIONS

Interntional Search Report for Application No. PCT/CN2015/071658 dated May 4, 2015.
(Continued)

*Primary Examiner* — Andrea Lindgren Baltzell
(74) *Attorney, Agent, or Firm* — Lerner, David, Littenberg, Krumholz & Mentlik, LLP

(57) ABSTRACT

The present invention discloses a phase shift system that is used for changing phases of signals transmitted to at least two radiation elements, comprising at least two phase shifters providing signals to the radiation elements, the phase shifter having a phase shift part used for moving so as to change phases of signals passing through the phase shifter. The system further comprises a phase shift drive device that is connected to the phase shift part of each phase shifter for synchronous linkage of all the phase shift parts, such that the phase shift parts move at different velocities to form a differential continuous phase distribution among the signals of the radiation elements. Through the above mode, the present invention can form a phase shift system with a relatively high number of ports by combining a plurality of phase shifters, and all the ports can form the differential continuous phase distribution.

13 Claims, 4 Drawing Sheets

(58) Field of Classification Search
USPC .......................................................... 343/853
See application file for complete search history.

(56) References Cited

FOREIGN PATENT DOCUMENTS

| | | | |
|---|---|---|---|
| CN | 102185180 | A | 9/2011 |
| CN | 103236585 | A | 8/2013 |
| CN | 103855471 | A | 6/2014 |
| CN | 203910971 | U | 10/2014 |
| GB | 2410838 | A | 8/2005 |
| WO | 2005062428 | A1 | 7/2005 |

OTHER PUBLICATIONS

Extended European search report for EP 15755904.8 dated Jan. 13, 2017, 3 pages.

\* cited by examiner

PHASE SHIFT SYSTEM

CROSS-REFERENCE TO RELATED APPLICATIONS

The present application is a national phase entry under 35 U.S.C § 371 of International Application No. PCT/CN2015/071658 filed Jan. 27, 2015, which claims priority from Chinese Application No. 201410070329.5 filed Feb. 27, 2014, all of which are hereby incorporated herein by reference.

FIELD OF THE INVENTION

The present invention relates to the mobile communications field, and in particular relates to a phase shift system.

DESCRIPTION OF THE RELATED ART

Currently, the electromagnetic environment for mobile communications becomes increasingly complex, and the requirements for antenna indices are increasingly high, for example, to increase the antenna upper side lobe suppression index, and moreover, the proposal of a requirement for upper side lobe suppression within 30 degrees above the main lobe. As an important component of mobile communication network construction, electrically controlled antennas need to also consider the upper side lobe suppression index in the entire range of electrically controlled inclination.

A multi-port phase shift system is a core device of an electrically controlled base station antenna to effectively suppress upper side lobe, when the number of its ports corresponds one-to-one to the number of radiation units, the design flexibility for shaping indices of antenna vertical planes is higher, and it is easier to design a shape pattern with excellent indices. For current lumped multi-port phase shift systems that are implemented based on sliding coupling feed sheets or slide phase shift media, when the number of antenna radiation units is increased such that the corresponding port number needs to be increased, a conventional method would lead to a complex structure of the multi-port phase shift system, increased design difficulty, and consequently to the difficult layout of the antenna feed system and difficulty in controlling consistency.

SUMMARY OF THE INVENTION

The technical problem mainly solved by the present invention is to provide a phase shift system, which can form a phase shift system with a relatively high number of ports by combining a plurality of phase shifters, and all the ports can form a differential continuous phase distribution.

To solve the above technical problem, one technical solution employed by the present invention is as follows: a phase shift system is provided, which is used for changing phases of signals transmitted to at least two radiation elements, comprising at least two phase shifters providing signals to the radiation elements, the phase shifter having a phase shift part used for moving so as to change phases of signals passing through the phase shifter, the system further comprises: a phase shift drive device that is connected with the phase shift part of each phase shifter for synchronous linkage of all the phase shift parts, such that the phase shift parts move at different velocities to form a differential continuous phase distribution among the signals of the radiation elements.

Wherein, the phase shift drive device comprises a synchronous linkage element and at least two variable-speed transmission devices; one end of each variable-speed transmission device is connected to the synchronous linkage element, and the other end thereof is connected to the phase shift part of one phase shifter; the movement of the synchronous linkage element causes the phase shift parts connected to all variable-speed transmission devices to move at different velocities.

Wherein, the phase shift drive device comprises a synchronous linkage element, a first variable-speed transmission device and a second variable-speed transmission device; one end of the first variable-speed transmission device is connected to the synchronous linkage element, and the other end thereof is connected to the phase shift part of the first phase shifter among the phase shifters; one end of the second variable-speed transmission device is connected to the synchronous linkage element, and the other end thereof is connected to the phase shift part of the second phase shifter among the phase shifters; the movement of the synchronous linkage element causes the first variable-speed transmission device and the second variable-speed transmission device to drive phase shift parts of the first phase shifter and the second phase shifter to move, respectively, at different velocities.

Wherein, the phase shift drive device comprises a synchronous linkage element and at least one variable-speed transmission device; one end of the variable-speed transmission device is connected to the synchronous linkage element, and the other end thereof is connected to the phase shift part of one phase shifter; the synchronous linkage element is directly connected to the phase shift part of another phase shifter; the movement of the synchronous linkage element causes the variable-speed transmission device to drive the phase shift part connected thereto and the phase shift part connected to the synchronous linkage element to move at different velocities.

Wherein, the variable-speed transmission device comprises a rack and a toothed wheel; the toothed wheel is connected to the phase shift part of the phase shifter; the rack is connected to the synchronous linkage element; the toothed wheel is connected, directly or indirectly, to the rack; the movement of the synchronous linkage element causes the rack to drive the toothed wheel to move, which consequently drives the corresponding phase shift part of the phase shifter to move.

Wherein, the synchronous linkage element is a straight bar, and the rack of the variable-speed transmission device is fixedly connected to the straight bar.

Wherein, the synchronous linkage element may also be a screw bar, and the rack of the variable-speed transmission device is formed with threads in its longitudinal direction for screw transmission connection with the screw bar.

Wherein, in all of the variable-speed transmission devices of the phase shift system, the rack structures are the same, and the toothed wheels are toothed wheels of different diameters and/or tooth numbers for the variable-speed transmission devices to drive the phase shift parts of the phase shifters connected thereto to move at different velocities. Alternatively, in all of the variable-speed transmission devices of the phase shift system, the rack structures are different, and the toothed wheel structures are the same for the variable-speed transmission devices to drive, at different velocities, the phase shift parts of the phase shifters connected thereto to move. Alternatively, in all of the variable-speed transmission devices of the phase shift system, neither the racks nor the toothed wheels have the same structure, such that the variable-speed transmission devices drive, at different velocities, the phase shift parts of the phase shifters connected thereto to move.

Wherein, the phase shifter is a lumped multi-port phase shifter with 1 divided into 5, a lumped multi-port phase shifter with 1 divided into 4, a lumped multi-port phase shifter with 1 divided into 3, or a two-port phase shifter with one in and one out, and one output port of each phase shifter is connected to a corresponding radiation element.

The advantageous effects of the present invention are as follows: unlike the prior art, the phase shift system according to the present invention comprises at least two phase shifters providing signals to the radiation elements, and a phase shift drive device, wherein the phase shifter has a phase shift part used for moving so as to change phases of signals passing through the phase shifter, the phase shift drive device may be connected with the phase shift part of each phase shifter for synchronous linkage of all the phase shift parts, such that the phase shift parts move at different velocities to form a differential continuous phase distribution among the signals of the radiation elements. Through the above mode, the present invention can form a phase shift system with a relatively high number of ports by combining a plurality of phase shifters, and all the ports can form the differential continuous phase distribution.

DETAILED DESCRIPTION OF THE EMBODIMENTS

The present invention will be described in detail below with reference to the accompanying drawings and embodiments.

Figure 1:
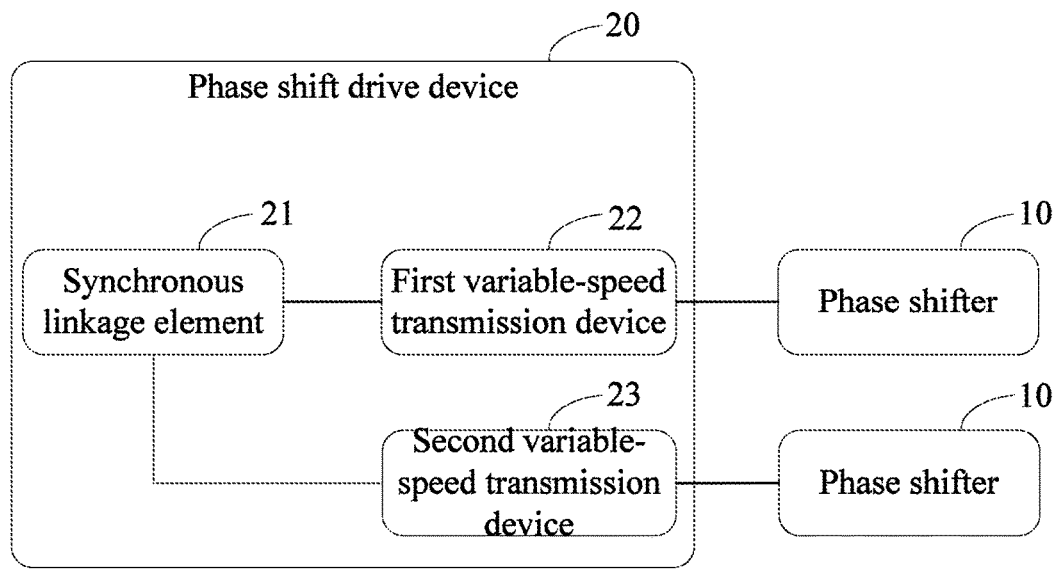
FIG. 1 is a block diagram I of the phase shift system according to the present invention.
Figure 2:
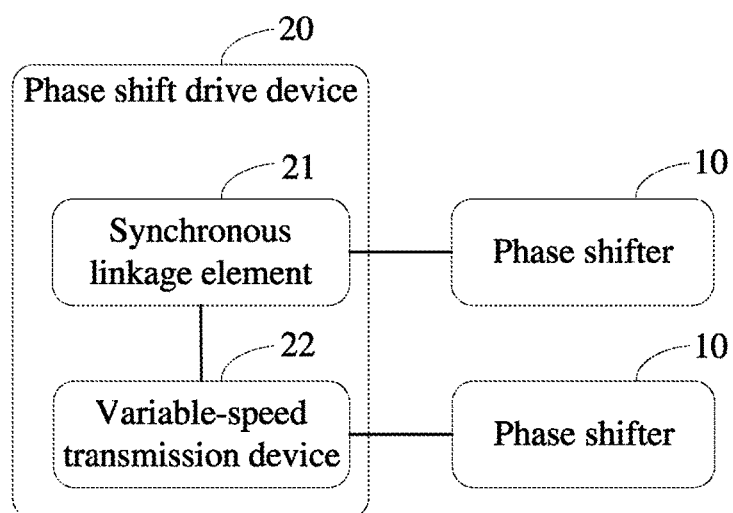
FIG. 2 is a block diagram II of the phase shift system according to the present invention.

Please refer to FIG. 1 and FIG. 2, FIG. 1 and FIG. 2 are block diagrams of the phase shift system according to the present invention, the phase shift system according to the present invention is used for changing phases of signals transmitted to at least two radiation elements, and consequently changing the elevation angle of antenna beams. As shown in FIG. 1 and FIG. 2, the phase shift system comprises two phase shifters 10 providing signals to the radiation elements and a phase shift drive device 20.

Wherein the phase shifter 10 has a phase shift part used for moving so as to change phases of signals passing through the phase shifter 10.

The phase shift drive device 20 is connected with the phase shift part of each phase shifter 10 for synchronous linkage of all the phase shift parts, such that the phase shift parts move at different velocities to form a differential continuous phase distribution among the signals of the radiation elements.

There are two kinds of connection modes between the phase shift drive device 20 and each phase shifter 10, as shown in FIG. 1 and FIG. 2, respectively.

As shown in FIG. 1, the phase shift system comprises two phase shifters 10 and a phase shift drive device 20, the phase shift drive device 20 comprising a synchronous linkage element 21, a first variable-speed transmission device 22 and a second variable-speed transmission device 23.

One end of the first variable-speed transmission device 22 is connected to the synchronous linkage element 21, and the other end thereof is connected to the phase shift part of one phase shifter 10. One end of the second variable-speed transmission device 23 is connected to the synchronous linkage element 21, and the other end thereof is connected to the phase shift part of another phase shifter 10.

It should be noted that one variable-speed transmission device corresponds to one phase shifter. In other embodiments, a phase shift system may comprise at least two phase shifters 10, and the phase shift drive device 20 may comprise at least two variable-speed transmission devices corresponding to the at least two phase shifters 10.

The movement of the synchronous linkage element 21 causes the first variable-speed transmission device 22 and the second variable-speed transmission device 23 to drive phase shift parts of the two phase shifters 10 to move, respectively, at different velocities.

As shown in FIG. 2, the phase shift system comprises two phase shifters 10 and a phase shift drive device 20, wherein the phase shift drive device 20 comprises a synchronous linkage element 21 and a variable-speed transmission device 22.

One end of the variable-speed transmission device 22 is connected to the synchronous linkage element 21, and the other end thereof is connected to the phase shift part of one phase shifter 10. The phase shift part of another phase shifter 10 is connected directly to the synchronous linkage element 21.

It should be noted that one variable-speed transmission device corresponds to one phase shifter. In other embodiments, a phase shift system may comprise at least two phase shifters 10, and the phase shift drive device 20 may comprise at least one variable-speed transmission device 22, the synchronous linkage element 21 is connected directly to the phase shift part of one phase shifter 10, and each variable-speed transmission device 22 is connected to the phase shift part of one remaining phase shifter 10, respectively.

The movement of the synchronous linkage element 21 causes the variable-speed transmission device 22 to drive the phase shift part of the phase shifter 10 connected thereto and the phase shift part of the phase shifter 10 connected to the synchronous linkage element 21 to move at different velocities.

In a practical application, with FIG. 1 as an example, the first variable-speed transmission device 22 and the second variable-speed transmission device 23 both comprise a rack and a toothed wheel, wherein the toothed wheel is connected to the phase shift part of the phase shifter 10, and the rack is connected to the synchronous linkage element 21. The toothed wheel is connected, directly or indirectly, to the rack, the movement of the synchronous linkage element 21 causes the rack to drive the toothed wheel to move, which consequently drives the corresponding phase shift part of the phase shifter 10 to move. Wherein, the mode of indirect meshing engagement between the toothed wheel and the rack is as follows: the rack, the first toothed wheel, and the second toothed wheel are sequentially engaged.

The synchronous linkage element 21 is a straight bar, and the rack of the first variable-speed transmission device 22 or the second variable-speed transmission device 23 is fixedly connected to the straight bar.

The synchronous linkage element 21 may also be a screw bar, and the rack of the first variable-speed transmission device 22 or the second variable-speed transmission device 23 is formed with threads in its longitudinal direction for screw transmission connection with the screw bar.

The engagement between the rack and the toothed wheels enables the toothed wheels to move at different velocities when the synchronous linkage element 21 moves, wherein the modes of engagement between the rack and the toothed wheels are as follows, one of which may be selected for configuration.

A. In all of the variable-speed transmission devices of the phase shift system, the rack structures are the same, and the toothed wheels are toothed wheels of different diameters and/or tooth numbers for the variable-speed transmission devices to drive the phase shift parts of the phase shifters connected thereto to move at different velocities.

B. In all of the variable-speed transmission devices of the phase shift system, the rack structures are different, and the toothed wheel structures are the same for the variable-speed transmission devices to drive, at different velocities, the phase shift parts of the phase shifters connected thereto to move.

C. In all of the variable-speed transmission devices of the phase shift system, neither the racks nor the toothed wheels have the same structure, such that the variable-speed transmission devices drive, at different velocities, the phase shift parts of the phase shifters connected thereto to move.

It should be noted that the phase shifter 10 is a lumped multi-port phase shifter with 1 divided into 5, a lumped multi-port phase shifter with 1 divided into 4, a lumped multi-port phase shifter with 1 divided into 3, or a two-port phase shifter with one in and one out, and one output port of each phase shifter 10 is connected to a corresponding radiation element.

Wherein, the number of ports of the phase shift system according to the present invention is the sum of the numbers of ports of all phase shifters, and the phases of all phase shifter ports change synchronously.

Wherein, the phase shift parts may be sliding feed sheets or phase shift media.

The phase shift system according to the present invention connects a plurality of lumped phase shifters through different movement velocities, such that the system forms a differential continuous phase distribution among the ports of all phase shifters. It has a relatively high number of ports, simple and novel design, reasonable dimension and structure, flexible use, and an extensive space for applications.

Figure 3:
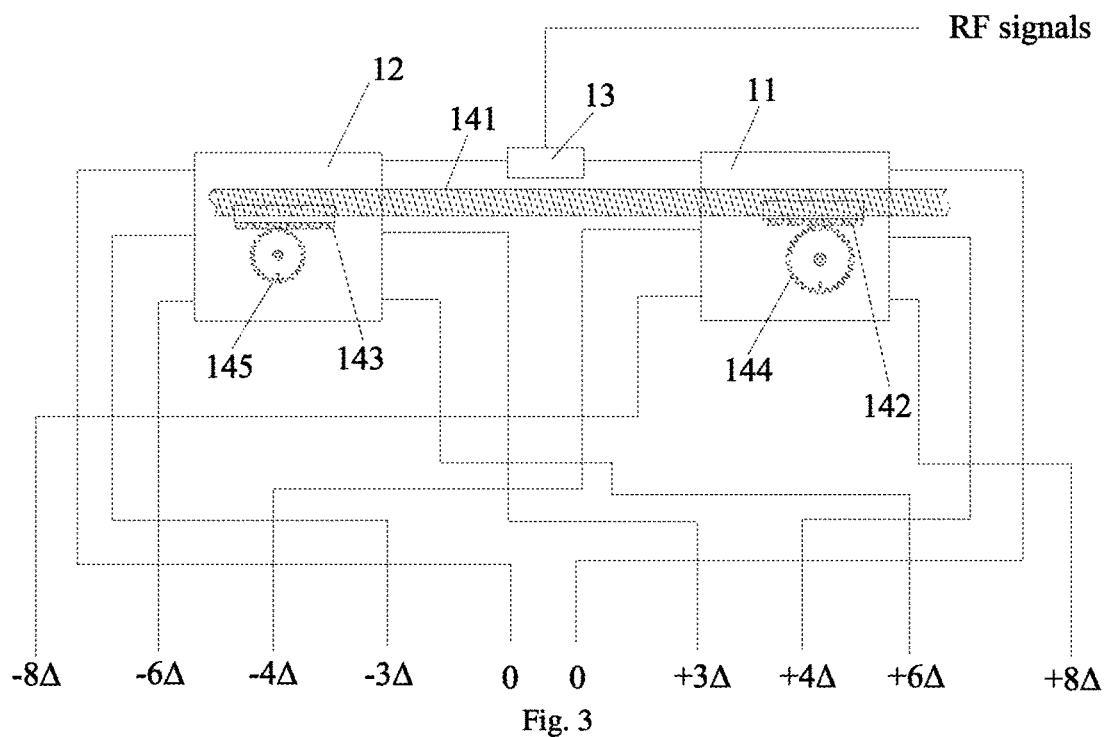
FIG. 3 is a schematic diagram of a first embodiment of the phase shift system according to the present invention.

Please refer to FIG. 3, and FIG. 3 is a schematic diagram of a first embodiment of the phase shift system according to the present invention. As shown in FIG. 3, it comprises a first phase shifter 11, a second phase shifter 12, a power divider 13 and a phase shift drive device (not shown).

The phase shift drive device comprises a screw bar 141, a first rack 142, a second rack 143, a first toothed wheel 144, and a second toothed wheel 145.

Specifically, the screw bar 141 rotates and drives the first rack 142 and the second rack 143 to move, and consequently the first rack 142 and the second rack 143 drive the first toothed wheel 144 and the second toothed wheel 145, respectively, to move. Since the first toothed wheel 144 and the second toothed wheel 145 are connected to the phase shift parts in the first phase shifter 11 and the second phase shifter 12, respectively, they can make the phase shift parts corresponding to the first toothed wheel 144 and the second toothed wheel 145, respectively, to move, which consequently leads to phase changes at the ports of the first phase shifter 11 and the second phase shifter 12.

In the present embodiment, both the first phase shifter 11 and the second phase shifter 12 use a lumped multi-port phase shifter with 1 divided into 5.

RF signals are fed by the power divider 13 to the first phase shifter 11 and the second phase shifter 12 after power division. The phase shift drive device drives the two phase shifters 11 and 12 in a unified way to realize phase shift.

In the present embodiment, by setting the first rack 142, the second rack 143, the first toothed wheel 144 and the second toothed wheel 145, such as the dimension of the racks, the diameter and tooth number of the toothed wheels, the movement velocity ratio of all the phase shift parts corresponding to the first toothed wheel 144 and the second toothed wheel 145 is M:N when the phase shift drive device is running, and within the same period of time, the journey ratio of all the phase shift parts is M:N, consequently a phase shift ratio of M:N is formed between the first phase shifter 11 and the second phase shifter 12.

Through the above mode, the present embodiment may form a ten-port phase shifter with 1 divided into 10.

In the present embodiment, the power divider 13 is used to perform power division on RF signals to the first phase shifter 11 and the second phase shifter 12. In other embodiments, the power divider 13 is not needed, and RF signals are directly input through the input port of a phase shifter.

Figure 4:
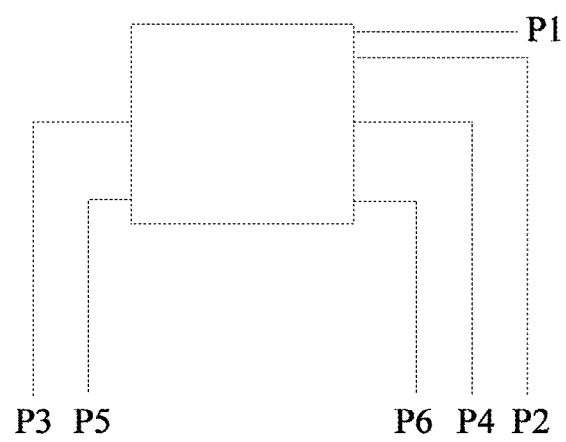
FIG. 4 is a schematic diagram of a first phase shifter in the first embodiment in FIG. 3.

Please refer to FIG. 4, and FIG. 4 is a schematic diagram of a first phase shifter in the first embodiment in FIG. 3. As shown in FIG. 4, the first phase shifter 11 comprises 6 ports, P1, P2, P3, P4, P5 and P6.

Wherein, the P1 port is an input port; the P2 port is a direct port with a phase shift amount being 0; the P3 and P4 ports have a phase shift amount of $-\Delta$ and $+\Delta$; the P5 and P6 ports have a phase shift amount of $-2\Delta$ and $+2\Delta$.

Considering FIG. 3 at the same time, when a journey ratio of M:N is formed by all the phase shift parts corresponding to the first phase shifter 11 and the second phase shifter 12, the phase shift amount of each port of the second phase shifter 12 is sequentially $$0, -\frac{N}{M}\Delta, \frac{N}{M}\Delta, -2\frac{N}{M}\Delta \text{ and } 2\frac{N}{M}\Delta.$$

Preferably, when M:N is 4:3, the phase shift amount of the first phase shifter 11 is sequentially 0, $-4\Delta$, $+4\Delta$, $-8\Delta$ and $+8\Delta$, and the phase shift amount of the second phase shifter 12 is sequentially 0, $-3\Delta$, $+3\Delta$, $-6\Delta$ and $+6\Delta$. All ports of the two phase shifters are combined and arranged again to form a phase distribution similar to differentiation: $-8\Delta$, $-6\Delta$, $-4\Delta$, $-3\Delta$, 0, 0, $+3\Delta$, $+4\Delta$, $+6\Delta$ and $+8\Delta$, which forms a ten-port phase shift system.

Wherein, if the second phase shifter 12 is optimized in design by keeping the maximum journey of the phase shift part therein consistent with that of the first phase shifter 11, a multi-port phase shift system with a better phase difference distribution can be formed by changing the phase shift ratio between the port of the first phase shifter 11 and the port of the second phase shifter 12.

It should be noted that a flexible configuration of power allocation ratio of the phase shifters and the power divider may lead to a combination with a taper distribution with a smoother amplitude. In the embodiment shown in FIG. 3, if the power allocation mode of the first phase shifter 11 is 1:3:4:3:1, the power allocation mode of the second phase shifter 12 is 1:2:3:2:1, and the power divider 13 is an equal power divider with one divided into two, then the final power allocation mode of the combination is 3:4:8:9:12:12:9:8:4:3 and a taper distribution with a smoother amplitude is formed.

Figure 5:
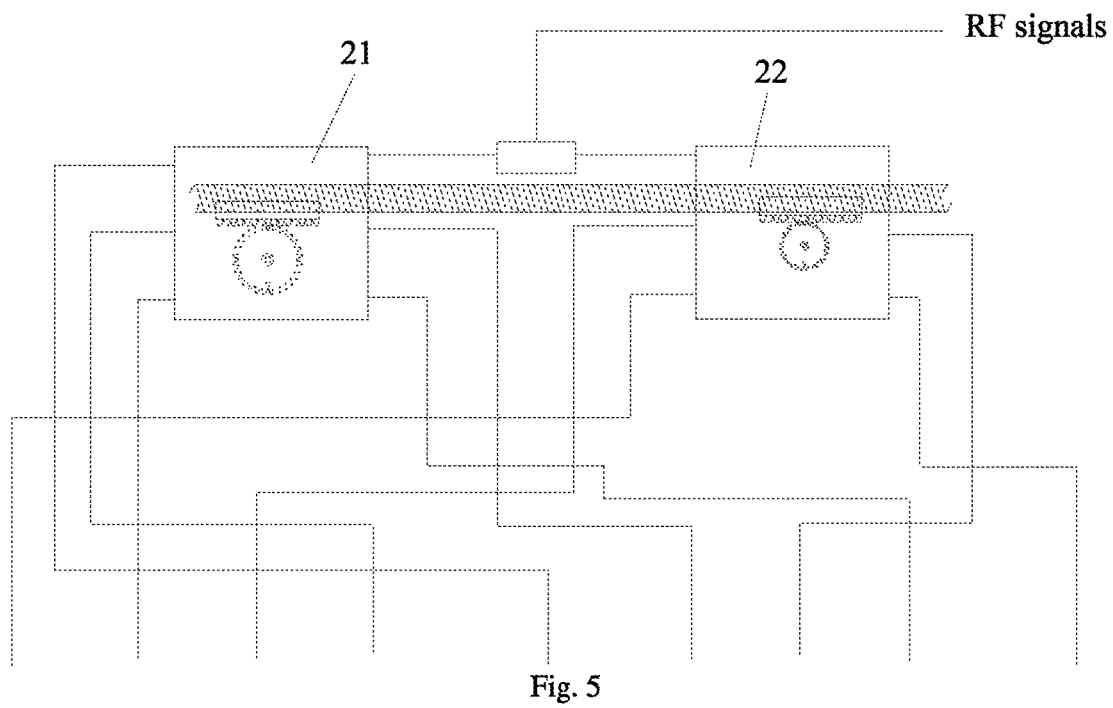
FIG. 5 is a schematic diagram of a second embodiment of the phase shift system according to the present invention.

Please refer to FIG. 5, and FIG. 5 is a schematic diagram of a second embodiment of the phase shift system according to the present invention. As shown in FIG. 5, it comprises a first phase shifter 21 and a second phase shifter 22. The phase shift system in the present embodiment has the same structure as in the embodiment shown in FIG. 3, which will not be repeated herein.

Wherein, the first phase shifter 21 is a lumped multi-port phase shifter with 1 divided into 5, and the second phase shifter 22 is a lumped multi-port phase shifter with 1 divided into 4. By setting the movement velocity ratio of the phase shift part in the first phase shifter 21 and the phase shift part in the second phase shifter 22, a nine-port phase shift system may be formed, e.g. its differential phase distribution is −8Δ, −6Δ, −4Δ, −2Δ, 0, +2Δ, +4Δ, +6Δ and +8Δ.

Wherein, the setting of the velocity ratio is achieved by the settings of the phase shift drive device.

Figure 6:
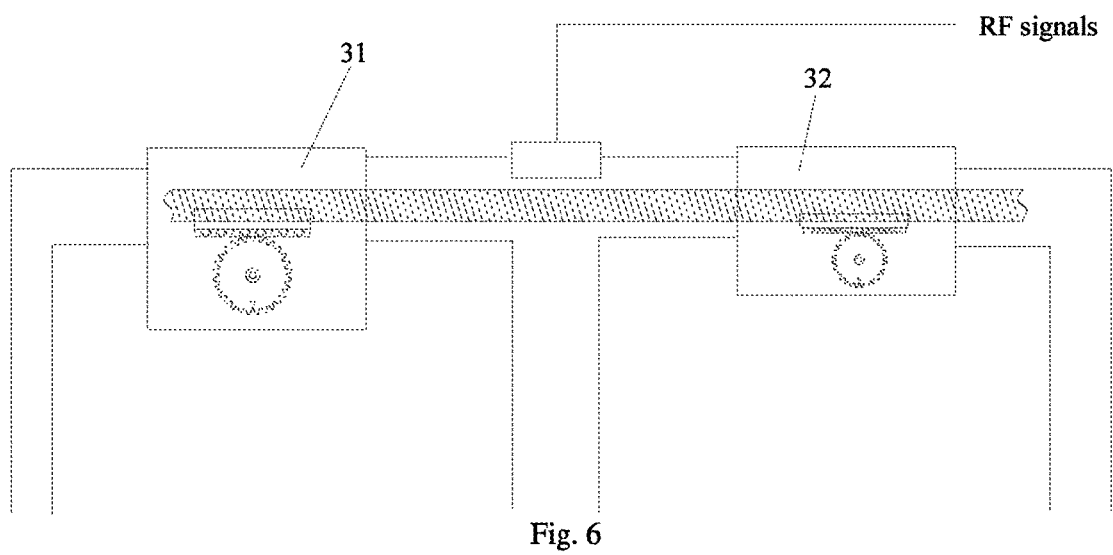
FIG. 6 is a schematic diagram of a third embodiment of the phase shift system according to the present invention.

Please refer to FIG. 6, and FIG. 6 is a schematic diagram of a third embodiment of the phase shift system according to the present invention. As shown in FIG. 6, it comprises a first phase shifter 31 and a second phase shifter 32. The phase shift system in the present embodiment has the same structure as in the embodiment shown in FIG. 3, which will not be repeated herein.

Wherein, both the first phase shifter 31 and the second phase shifter 32 are a lumped multi-port phase shifter with 1 divided into 3. A six-port phase shift system may be formed by setting the movement velocity ratio of the phase shift part in the first phase shifter 31 and the phase shift part in the second phase shifter 32.

As shown in FIGS. 3 to 6, when the phase shift system according to the present invention is running, RF signals enter a plurality of phase shifters, by means of the engagement between the racks and the toothed wheels, the phase shift drive device may act on the plurality of phase shifters at different transmission velocities, i.e. the phase shift part in each phase shifter moves at a different velocity, such that phase variations with fixed ratios are produced among the ports of the plurality of phase shifters. Wherein, the phase ratio of the port corresponding to each phase shifter is the same as the movement velocity ratio of the phase shift part in each phase shifter. With an appropriate movement velocity ratio, a differential continuous phase distribution can be formed among all the ports.

Figure 7:
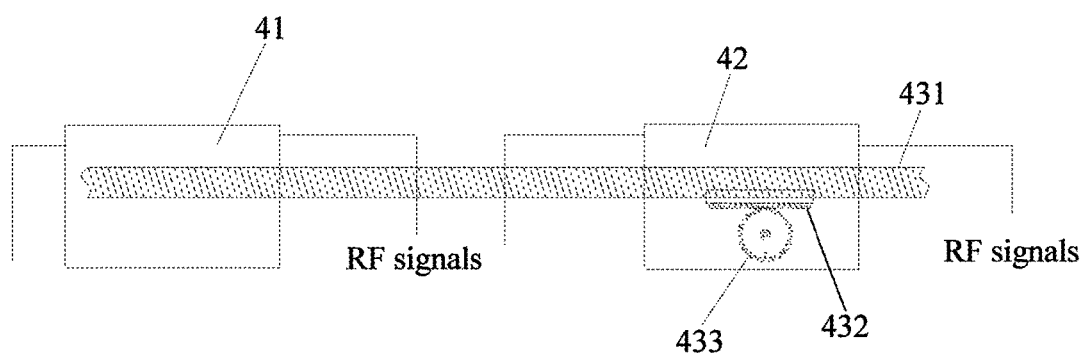
FIG. 7 is a schematic diagram of a fourth embodiment of the phase shift system according to the present invention.

Please refer to FIG. 7, and FIG. 7 is a schematic diagram of a fourth embodiment of the phase shift system according to the present invention. As shown in FIG. 7, it comprises a first phase shifter 41, a second phase shifter 42 and a phase shift drive device (not shown).

The phase shift drive device comprises a screw bar 431, a rack 432, and a toothed wheel 433.

The screw bar 431 is connected to the phase shift part in the first phase shifter 41, and the toothed wheel 433 is connected to the phase shift part in the second phase shifter 42.

Wherein, both the first phase shifter 41 and the second phase shifter 42 use a two-port phase shifter with one in and one out.

In the present embodiment, by setting the movement velocity ratio of the phase shift part in the first phase shifter 41 and the phase shift part in the second phase shifter 42, the actual journey of the phase shift part in the first phase shifter 41 is M, the actual journey of the phase shift part in the second phase shifter 42 is N, and therefore the phase shift amount is different for the ports of the first phase shifter 41 and the second phase shifter 42.

The selection of an appropriate movement velocity ratio can lead to a flexible ratio of phase shift amount between the first phase shifter 41 and the second phase shifter 42. A common situation is that, when the movement velocity ratio is 2:1, assume the phase shift amount of the first phase shifter 41 is Δ, then the phase shift amount of the second phase shifter 42 is 0.5Δ.

Wherein, the movement velocity ratio of 2:1 is achieved by the settings of the phase shift drive device.

Wherein, when the phase shifter is a basic phase shift unit with one in and one out, by setting a movement velocity ratio of M:N, a phase shifter with a phase shift amount at N/M times of the phase shift amount of the basic phase shift unit can be designed through derivation from the basic phase shift unit. The derived phase shifter can be jointly used with the basic phase shift unit to flexibly construct distributed multi-port phase shift systems.

Figure 8:
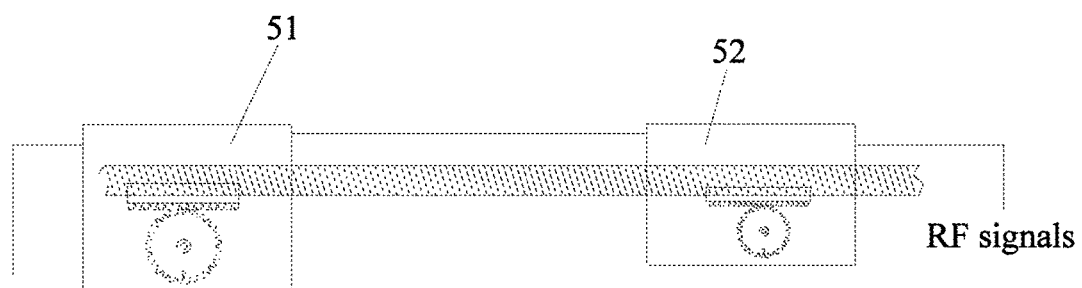
FIG. 8 is a schematic diagram of a fifth embodiment of the phase shift system according to the present invention.

Please refer to FIG. 8, and FIG. 8 is a schematic diagram of a fifth embodiment of the phase shift system according to the present invention. As shown in FIG. 8, it comprises a first phase shifter 51, a second phase shifter 52 and a phase shift drive device (not shown), wherein the phase shift drive device has the same structure as that in the embodiment shown in FIG. 3.

The first phase shifter 51 and the second phase shifter 52 are two-port phase shifters with one in and one out, and the output port of the second phase shifter 52 is the input port of the first phase shifter 51. The cascading phase shifters in the present embodiment can form any phase shift between Δ and 2Δ by setting different movement velocity ratios of the phase shift part in the first phase shifter 51 and the phase shift part in the second phase shifter 52.

The summary, the design solutions according to the present invention can be combined to form multi-port phase shift systems with five ports, six ports, seven ports, eight ports, nine ports, ten ports and even more ports. The present invention realizes a phase shift network with doubled port numbers by combining simple lumped phase shifters with relatively small sizes.

Only embodiments of the present invention are described below, which are not intended to limit the patent scope of the present invention. Any equivalent structure or equivalent flow change by using the Specification and Drawings of the present invention, or direct or indirect applications in other related technical fields shall be similarly encompassed by the present invention.

The invention claimed is:

1. A phase shift system for changing phases of signals transmitted to at least two radiation elements, comprising at least two phase shifters providing signals to the radiation elements, the phase shifters having a phase shift part used for moving to change phases of signals passing through the phase shifters, characterized in that the system further comprises:

a phase shift drive device connected to the phase shift part of each phase shifter configured for synchronous linkage of all the phase shift parts, wherein the phase shift parts move synchronously at different velocities to form a differential continuous phase distribution among the signals of the radiation elements.

2. The phase shift system according to claim 1, characterized in that the phase shift drive device comprises a synchronous linkage element and at least two variable-speed transmission devices;
one end of each variable-speed transmission device is connected to the synchronous linkage element, and the other end thereof is connected to the phase shift part of one phase shifter;
the movement of the synchronous linkage element causes the phase shift parts connected to all variable-speed transmission devices to move at different velocities.

3. The phase shift system according to claim 2, characterized in that the phase shift drive device comprises a synchronous linkage element, a first variable-speed transmission device and a second variable-speed transmission device;
one end of the first variable-speed transmission device is connected to the synchronous linkage element, and the other end thereof is connected to the phase shift part of the first phase shifter among the phase shifters;
one end of the second variable-speed transmission device is connected to the synchronous linkage element, and the other end thereof is connected to the phase shift part of the second phase shifter among the phase shifters;
the movement of the synchronous linkage element causes the first variable-speed transmission device and the second variable-speed transmission device to drive phase shift parts of the first phase shifter and the second phase shifter to move, respectively, at different velocities.

4. The phase shift system according to claim 1, characterized in that the phase shift drive device comprises a synchronous linkage element and at least one variable-speed transmission device;
one end of the variable-speed transmission device is connected to the synchronous linkage element, and the other end thereof is connected to the phase shift part of one phase shifter;
the synchronous linkage element is directly connected to the phase shift part of another phase shifter;
the movement of the synchronous linkage element causes the variable-speed transmission device to drive the phase shift part connected thereto and the phase shift part connected to the synchronous linkage element to move at different velocities.

5. The phase shift system according to claim 2, characterized in that the variable-speed transmission device comprises a rack and a toothed wheel; the toothed wheel connected to the phase shift part of the corresponding phase shifter; the rack connected to the synchronous linkage element; the toothed wheel meshing engaged, directly or indirectly, to the rack; and the movement of the synchronous linkage element causes the rack to drive the toothed wheel to move, which consequently drives the corresponding phase shift part of the phase shifter to move.

6. The phase shift system according to claim 5, characterized in that the synchronous linkage element is a straight bar, and the rack of the variable-speed transmission device is fixedly connected to the straight bar.

7. The phase shift system according to claim 5, characterized in that the synchronous linkage element is a screw bar, and the rack of the variable-speed transmission device is formed with threads in its longitudinal direction for screw transmission connection with the screw bar.

8. The phase shift system according to claim 5, characterized in that, in all of the variable-speed transmission devices of the phase shift system, the rack structures are the same, and the toothed wheels are toothed wheels of different diameters and/or tooth numbers for the variable-speed transmission devices to drive the phase shift parts of the phase shifters connected thereto to move at different velocities.

9. The phase shift system according to claim 5, characterized in that, in all of the variable-speed transmission devices of the phase shift system, the rack structures are different, and the toothed wheel structures are the same for the variable-speed transmission devices to drive, at different velocities, the phase shift parts of the phase shifters connected thereto to move.

10. The phase shift system according to claim 5, characterized in that, in all of the variable-speed transmission devices of the phase shift system, neither the racks nor the toothed wheels have the same structure, such that the variable-speed transmission devices drive, at different velocities, the phase shift parts of the phase shifters connected thereto to move.

11. The phase shift system according to claim 1, characterized in that the phase shifter is a lumped multi-port phase shifter with 1 divided into 5, a lumped multi-port phase shifter with 1 divided into 4, a lumped multi-port phase shifter with 1 divided into 3, or a two-port phase shifter with one in and one out, and one output port of each phase shifter is connected to a corresponding radiation element.

12. A phase shift system for changing phases of signals transmitted to at least two radiation elements, comprising at least two phase shifters providing signals to the radiation elements, the phase shifters having a phase shift part used for moving to change phases of signals passing through the phase shifters, the system further comprising a phase shift drive device that is connected to the phase shift part of each phase shifter configured for synchronous linkage of all the phase shift parts, such that the phase shift parts move at different velocities to form a differential continuous phase distribution among the signals of the radiation elements;
wherein the phase shifter is a lumped multi-port phase shifter with 1 divided into 5, a lumped multi-port phase shifter with 1 divided into 4, a lumped multi-port phase shifter with 1 divided into 3, or a two-port phase shifter with one in and one out, and one output port of each phase shifter is connected to a corresponding radiation element.

13. A phase shift system for changing phases of signals transmitted to at least two radiation elements, comprising at least two phase shifters providing signals to the radiation elements, the phase shifters having a phase shift part used for moving to change phases of signals passing through the phase shifters, the system further comprising a phase shift drive device that is connected to the phase shift part of each phase shifter configured for synchronous linkage of all the phase shift parts, such that the phase shift parts move at different velocities to form a differential continuous phase distribution among the signals of the radiation elements;
wherein the phase shift drive device comprises a synchronous linkage element and at least two variable-speed transmission devices; one end of each variable-speed transmission device connected to the synchronous linkage element, and the other end thereof connected to the phase shift part of one phase shifter; the movement of the synchronous linkage element causes the phase shift parts connected to all variable-speed transmission devices to move at different velocities; and wherein the variable-speed transmission device comprises a rack and a toothed wheel; the toothed wheel connected to the phase shift part of the corresponding phase shifter; the rack connected to the synchronous linkage element; the toothed wheel meshing engaged, directly or indirectly, to the rack; and the movement of the synchronous linkage element causes the rack to drive the toothed wheel to move, which drives the corresponding phase shift part of the phase shifter to move.

\* \* \* \* \*